United States Patent
Wyland

(10) Patent No.: US 10,999,923 B2
(45) Date of Patent: May 4, 2021

(54) STRUCTURE FOR CIRCUIT INTERCONNECTS

(71) Applicant: Juniper Networks, Inc., Sunnyvale, CA (US)

(72) Inventor: Christopher Paul Wyland, Livermore, CA (US)

(73) Assignee: Juniper Networks, Inc., Sunnyvale, CA (US)

(*) Notice: Subject to any disclaimer, the term of this patent is extended or adjusted under 35 U.S.C. 154(b) by 191 days.

(21) Appl. No.: 15/963,259

(22) Filed: Apr. 26, 2018

(65) Prior Publication Data

US 2019/0335579 A1 Oct. 31, 2019

(51) Int. Cl.
| | |
|---|---|
| *H05K 3/46* | (2006.01) |
| *H05K 1/02* | (2006.01) |
| *H05K 1/11* | (2006.01) |
| *H05K 3/40* | (2006.01) |

(52) U.S. Cl.
CPC .......... *H05K 1/0251* (2013.01); *H05K 1/115* (2013.01); *H05K 3/4038* (2013.01); *H05K 3/46* (2013.01); *H05K 2201/0776* (2013.01); *H05K 2201/093* (2013.01)

(58) Field of Classification Search
CPC .................................................. H05K 1/0251
USPC ....................................................... 174/251
See application file for complete search history.

(56) References Cited

U.S. PATENT DOCUMENTS

| | | | |
|---|---|---|---|
| 2002/0034839 A1* | 3/2002 | Iwaki | H01L 23/66 438/107 |
| 2010/0314163 A1 | 12/2010 | Twardy et al. | |
| 2011/0095851 A1* | 4/2011 | Wyland | H01L 23/66 333/219 |
| 2011/0147068 A1 | 6/2011 | Cahill et al. | |
| 2013/0097577 A1* | 4/2013 | Byrne | G06F 30/398 716/137 |
| 2013/0199833 A1* | 8/2013 | Park | H05K 1/115 174/264 |
| 2014/0306776 A1* | 10/2014 | Eom | H01P 5/028 333/1 |
| 2016/0120026 A1* | 4/2016 | Kawazu | H05K 1/025 333/34 |
| 2016/0284626 A1* | 9/2016 | Gandhi | H01L 23/481 |

FOREIGN PATENT DOCUMENTS

EP 2494598 9/2015

OTHER PUBLICATIONS

"European Application Serial No. 19165951.5, Extended European Search Report dated Oct. 23, 2019", 9 pgs.

* cited by examiner

*Primary Examiner* — Stanley Tso
(74) *Attorney, Agent, or Firm* — Schwegman Lundberg & Woessner, P.A.

(57) ABSTRACT

Described are various configurations of high-speed via structures. Various embodiments can reduce or entirely eliminate insertion loss in high-speed signal processing environments by using impedance compensation structures that decrease a mismatch in components of a circuit. An impedance compensation structure can include a metallic structure placed near a via to lower an impedance difference between the via and a conductive pathway connected to the via.

17 Claims, 14 Drawing Sheets

STRUCTURE FOR CIRCUIT INTERCONNECTS

TECHNICAL FIELD

The present disclosure generally relates to processing signals, and more particularly to circuit interconnects.

BACKGROUND

Some circuits place components on different layers (e.g., wafer layers), which can be stacked upon one another vertically and connected through interconnect structures, such as vias. By stacking circuit layers, the overall size and power requirements of the circuit package can be drastically reduced. While these multi-layer circuits may have a small footprint, the small size often limits the number, type, and placement of components that can be included in a given design. As such, there is often a trade-off between a multi-layer circuit design's size and performance.

BRIEF DESCRIPTION OF THE DRAWINGS

To easily identify the discussion of any particular element or act, the most significant digit or digits in a reference number refer to the figure ("FIG.") number in which that element or act is first introduced.

DETAILED DESCRIPTION

Figure 1:
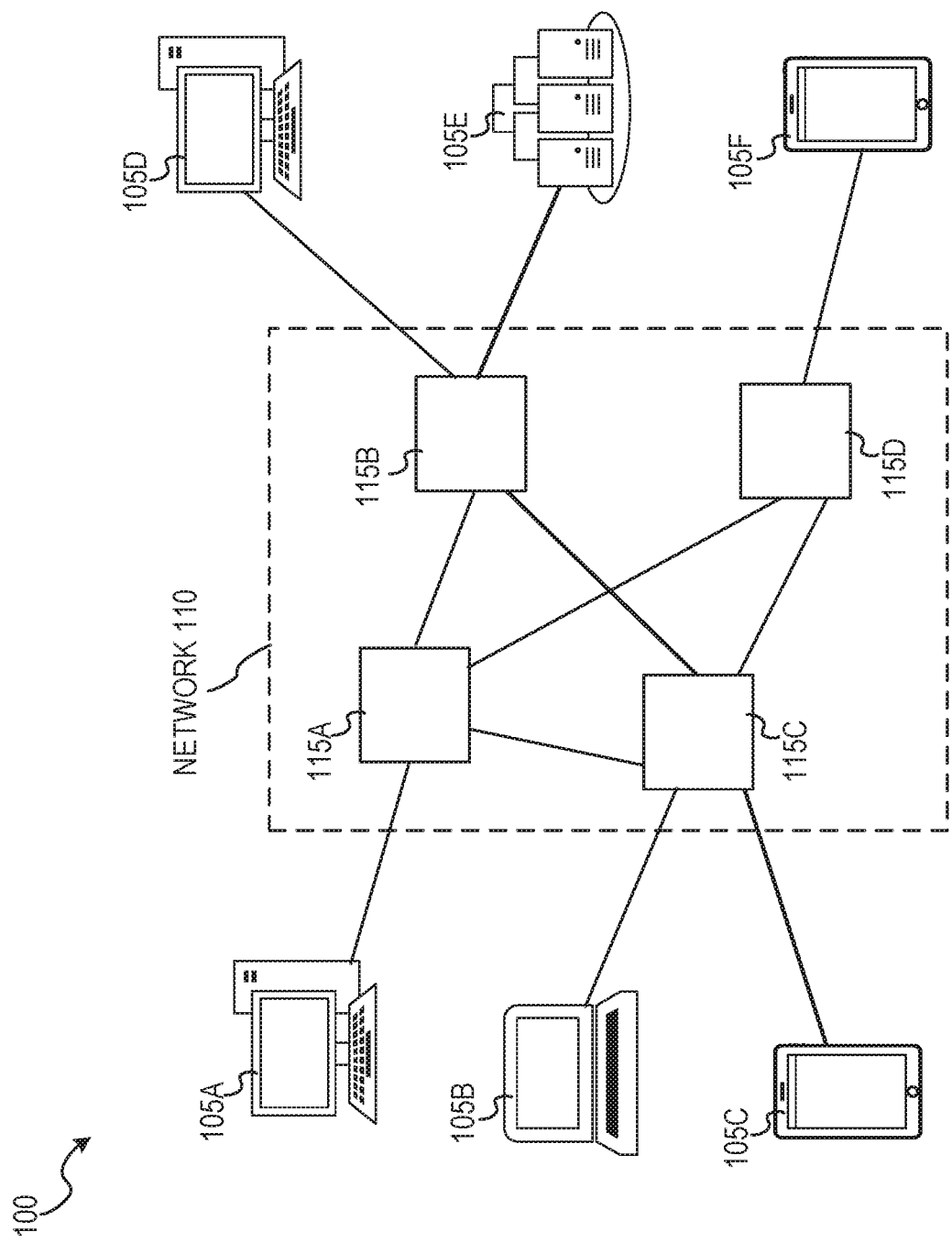
FIG. 1 shows an example network architecture in which high-speed via interface structures can be implemented, according to some example embodiments.

In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, structures, and techniques are not necessarily shown in detail.

On a single-layer circuit board different electrical components can be connected through an electrically conductive pathway, such as copper. Some circuit boards can be designed using a multilayer approach in which multiple layers or boards are stacked upon each other and glued together. To make connections between components on different layers, holes are drilled through the layers and metal barrels, or "vias", are inserted and connected to conductive pathways on the different layers. As used herein, the conductive pathways are referred to as traces, which can be placed directly upon a substrate of a board before or after components are placed or otherwise integrated into the circuit.

As mentioned, there can be difficulties in designing high-performance multilayer circuits. One such difficulty includes designing a multilayer circuit that performs well in high-speed environments, such as a modern communication network that uses photonic circuit designs. In such environments, reducing the amount of insertion loss is often important. Generally, insertion loss is a measure of signal loss caused by a given device. One source of insertion loss in a multilayer circuit arises from impedance mismatch between vias and traces. For example, a via structure may have an impedance of 100 ohms while the trace to which the via structure is connected may have an impedance of 30 ohms. The impedance mismatch causes a signal reflection, thereby decreasing the amount of signal transmitted and creating insertion loss.

To this end, a high-speed via structure can be specially configured to decrease impedance mismatches and resulting insertion loss using one or more insertion compensation structures. In one example embodiment, an insertion compensation structure is a metallic pad that is positioned directly underneath a via structure to lower that via structure's impedance such that it is close to the trace to which the via structure is connected. In some example embodiments, the size of the impedance compensation structure coincides with the size of a corresponding trace in that the length or side of the impedance compensation structure is the same as the width of the trace. In some example embodiments, the size (e.g., the size of one of the sides) of the impedance compensation structure substantially coincides with the width of the corresponding trace in that the size of the impedance compensation structure is slightly larger or smaller than the width of the trace or within 30% of the width of the trace. In this way, impedance mismatch can be reduced and the insertion loss and performance of entire systems can be improved.

FIG. 1 shows an example network architecture 100 in which high-speed via interface structures can be implemented, according to some example embodiments. The network architecture 100 comprises a plurality of endpoints 105A-105F (e.g., computers such as a laptop or tablet servers or routing devices in a data center, etc.) that send data back and forth over a network, such as network 110. The network 110 comprises a plurality of high-speed optical components 115A-115D that route light carrying signals between the plurality of endpoints 105A-105F. Although only four high-speed optical components 115A-115D are illustrated in FIG. 1, the network 110 can include a multitude of components to increase the overall bandwidth of the network 110. The high-speed optical components 115A-115 are examples in which high-speed via structures can be implemented. For example, high-speed optical component 115A can be a silicon photonic based chip that operates at high-speeds to route signals between endpoints 105A and 105F. Further, as one of ordinary skill in the art, any of the end points can be configured as high-speed devices using the embodiments disclosed herein. For example, end point 105E can include high-speed electrical or optical components that generate signals for transmission to devices over the network 110.

Figure 2:
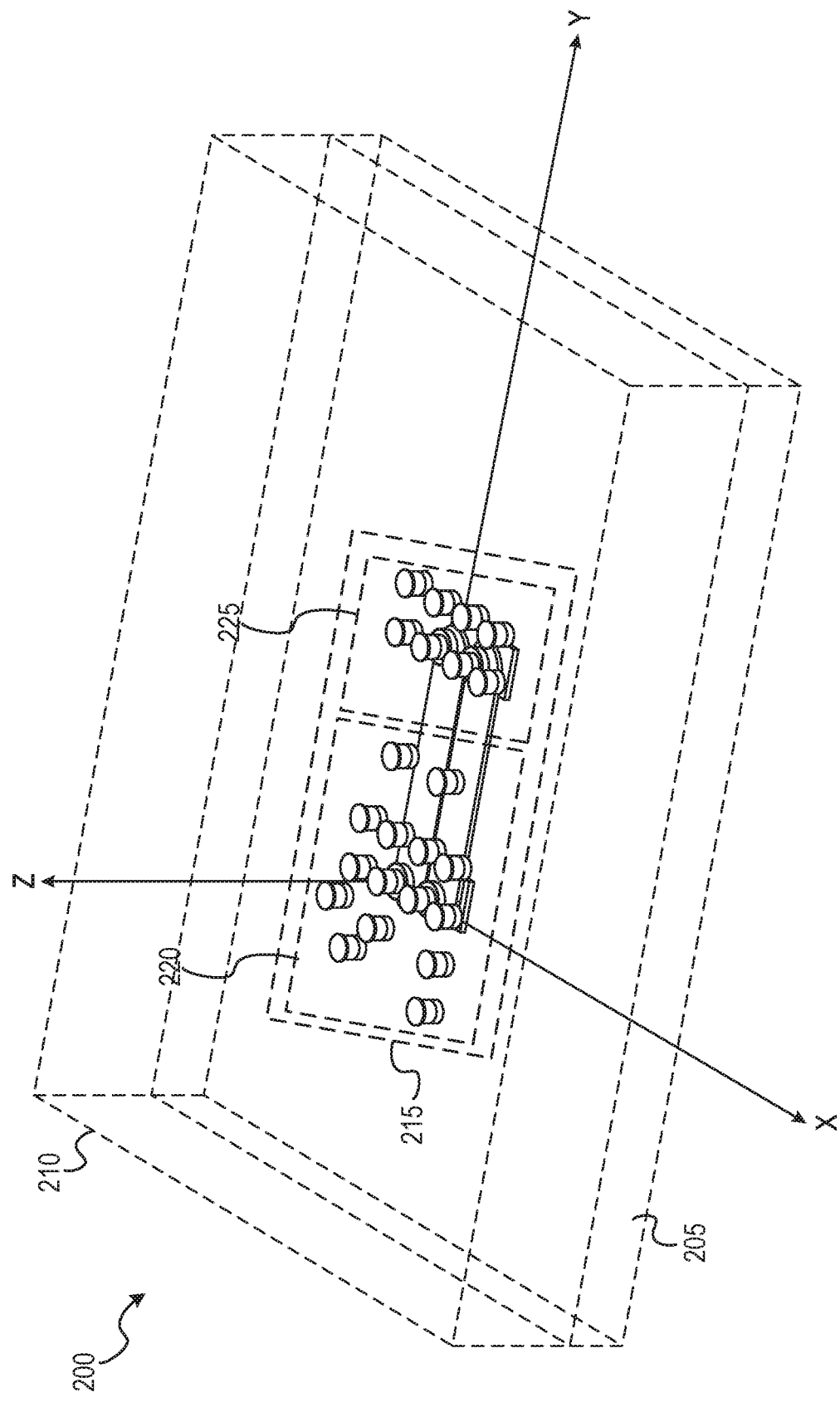
FIG. 2 shows an example circuit package which can be integrated into a network component, according to some example embodiments.

FIG. 2 shows an example circuit package 200 which can be integrated into one of the network components of FIG. 1 (e.g. high-speed optical component 115A), according to some example embodiments. The circuit package 200 can include one or more grounding planes 205 (denoted by the lower rectangular structure in dotted line), which provide a ground or reference voltage for the circuit package 200. The circuit package 200 can further include circuit module structure 210 (the upper rectangular structure in dotted line), in which one or more circuit dies can be integrated. The circuit dies integrated into the circuit module structure 210 can interface with each other through a high-speed via interface structure, such as high-speed interface via structure 215, which can include a plurality of terminals, vias, and conductive pathways that transfer signals between the various circuits (e.g., circuit portions, circuit dies) of the circuit module structure 210, according to some example embodiments. For example, a photonic integrated circuit (PIC) die can interface with one or more of the terminals depicted in interface section 220 of the high-speed interface via structure 215, while a transceiver circuit die can interface with one or more of the terminals depicted in interface section 225 of the high-speed interface via structure 215. In some example embodiments, the signals conveyed between different components of the circuit module structure 210 (e.g., a PIC die, transceiver die, etc.) are PAM4 signals operating at 50 Ghz and harmonics thereof, though one of ordinary skill in the art appreciates that other signals types and configurations can likewise be implemented.

Figure 3:
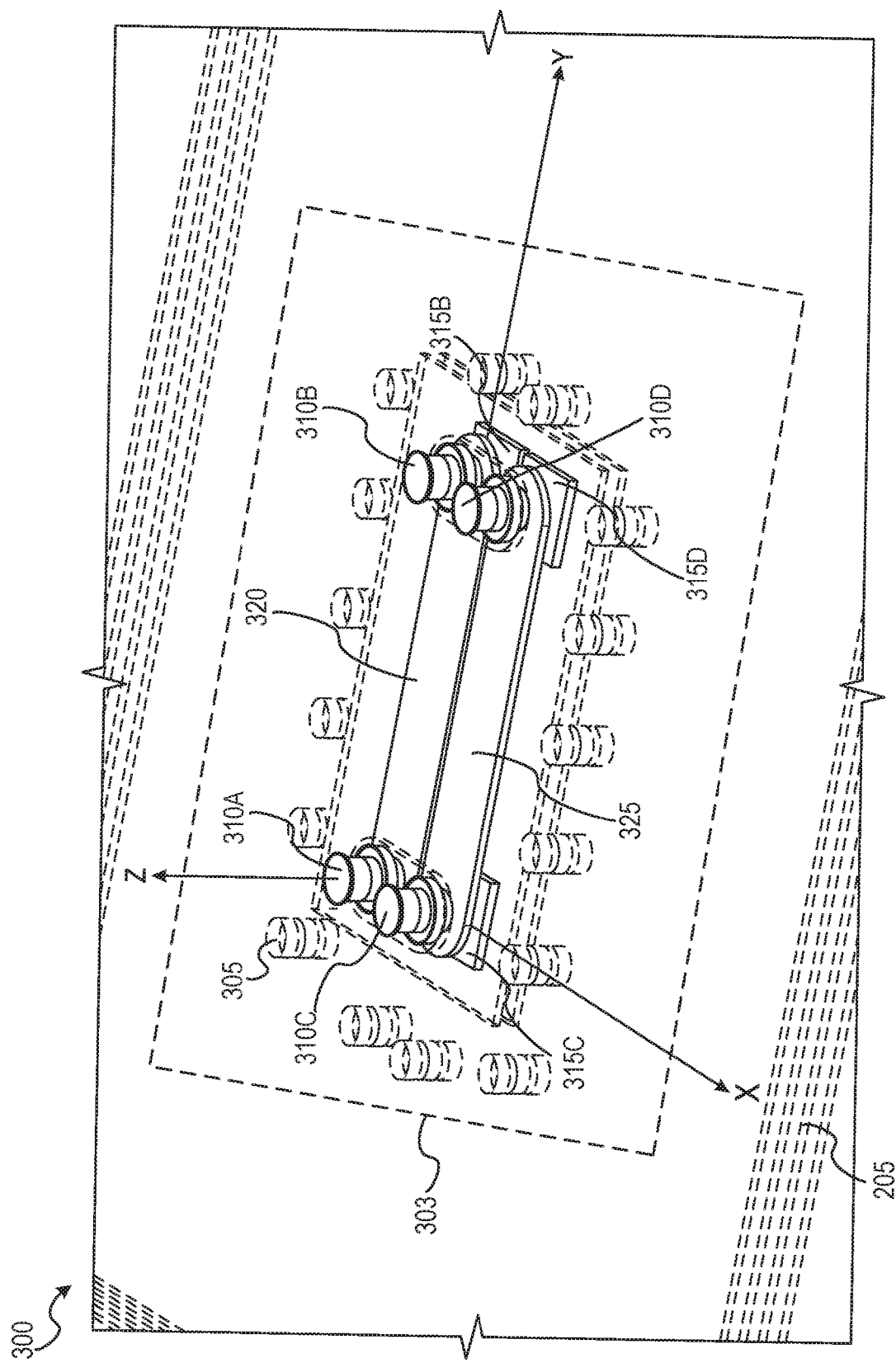
FIG. 3 shows a top perspective view of an example high-speed via interface structure, according to some example embodiments.

FIG. 3 shows a top perspective view 300 of an example high-speed via interface structure 303, according to some example embodiments. The high-speed via interface structure 303 is an example of an interface structure that can connect one or more circuit dies of a circuit module structure 210, as discussed above. As illustrated in FIG. 3, the high-speed via interface structure 303 can include one or more ground vias, such as ground via 305. Further illustrated in interface structure 303 are via structures 310A-310D, which extend through one or more portions or layers of a circuit (e.g., a multilayer circuit). As discussed in further detail below, a via structure can include a via barrel, a metallic pillar that is soldered to the via barrel, and a conductive pad or contact disposed on top of the metallic pillar or via barrel.

In the example of FIG. 3, via structure 310A is electrically connected to via structure 310B by conductive pathway 320 (e.g. a trace). Similarly, via structure 310C is electrically connected to via structure 310D by conductive pathway 325.

In the example of FIG. 3, the interface structure 303 is an example of a stripline configuration in which the conductive pathways 320, 325 are traces embedded in a dielectric substrate of the circuit package 200. The interface structure 303 further includes impedance compensation structures 315A-315D, which are positioned directly beneath their corresponding vias, according to some example embodiments. That is, for example, impedance compensation structure 315B is positioned or otherwise disposed directly beneath and axially aligned with via structure 310B. Likewise, impedance compensation structure 315D is positioned under via structure 310D, impedance compensation structure 315C is positioned under via structure 310C, and impedance compensation structure 315A (not visible from the top perspective view 300 of FIG. 3) is located directly underneath and axially aligned with via structure 310A.

In some example embodiments, the impedance compensation structures are configured as square structures, with a side dimension measurement that is the same or approximately the same (e.g., within 30%) as the measurement of the width of the connection pathway or the width of the corresponding via structure. For example, impedance compensation structure 315D is a square with a side length that is the same size as the width of conductive pathway 325. As an additional example, impedance compensation structure 315D can be a square with a side length that is the same size as the width of impedance compensation structure 310D.

Although a stripline configuration is discussed with reference to some of the figures (e.g., FIGS. 3-10), in some example embodiments, high-speed via interfaces can be structured using other configurations, such as a microstrip configuration as discussed in further detail below with reference to FIG. 11.

Figure 4:
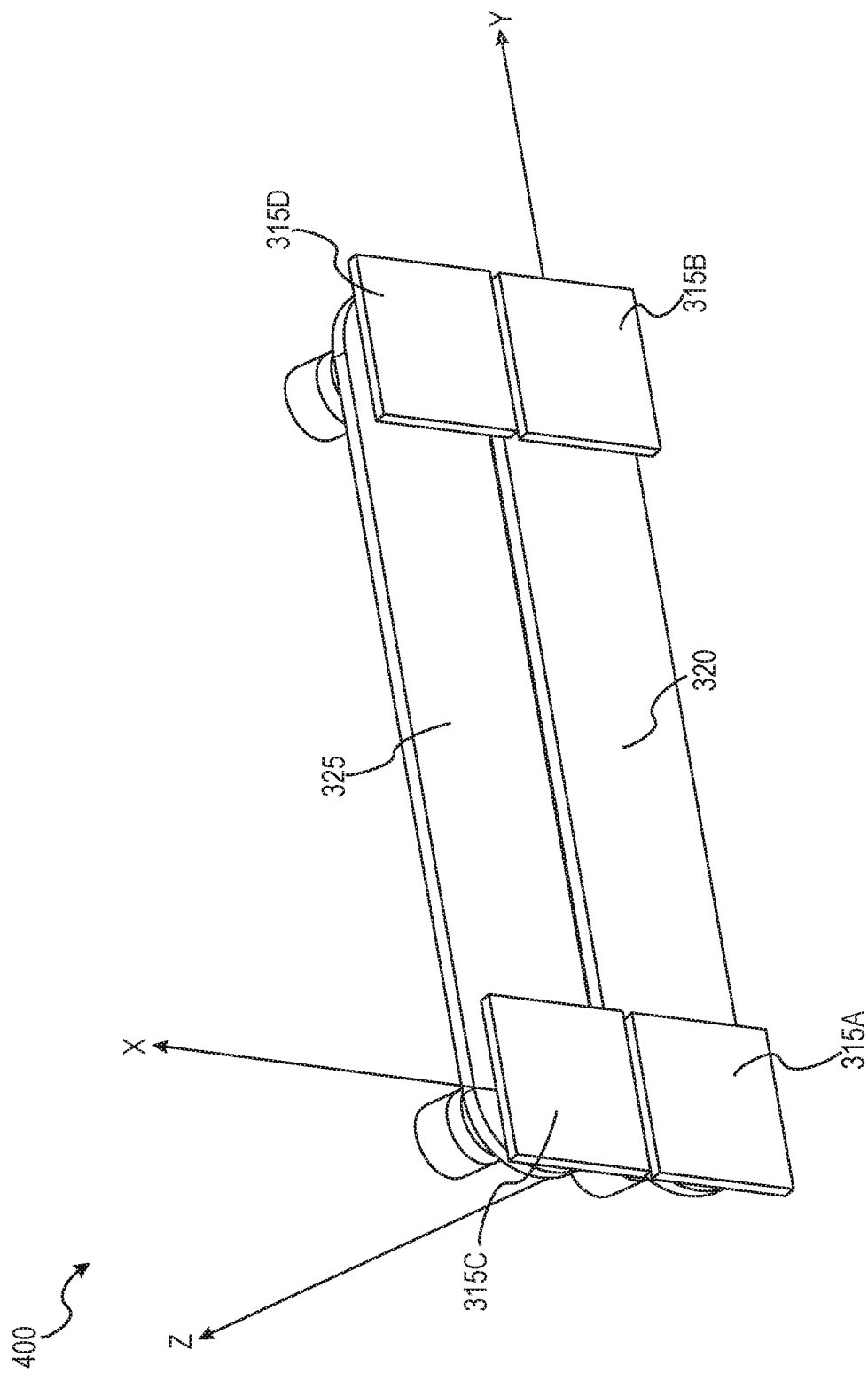
FIG. 4 shows an underside view of the interface structure, according to some example embodiments.

FIG. 4 shows an underside view 400 of the interface structure 303, according to some example embodiments. From the underside view 400, all four impedance compensation structures 315A-315D are visible. As illustrated, the impedance compensation structures 315A-315D are physically separated from the dies under which they are situated by a distance, e.g. 25 µm. The distance between the impedance compensation structures and the via structures is filled with a dielectric substrate of a layer of the circuit package 200, according to some example embodiments. As such, the impedance compensation structures 315A-315D are floating in the substrate and are electrically isolated from their corresponding via structures, according to some example embodiments.

Figure 5:
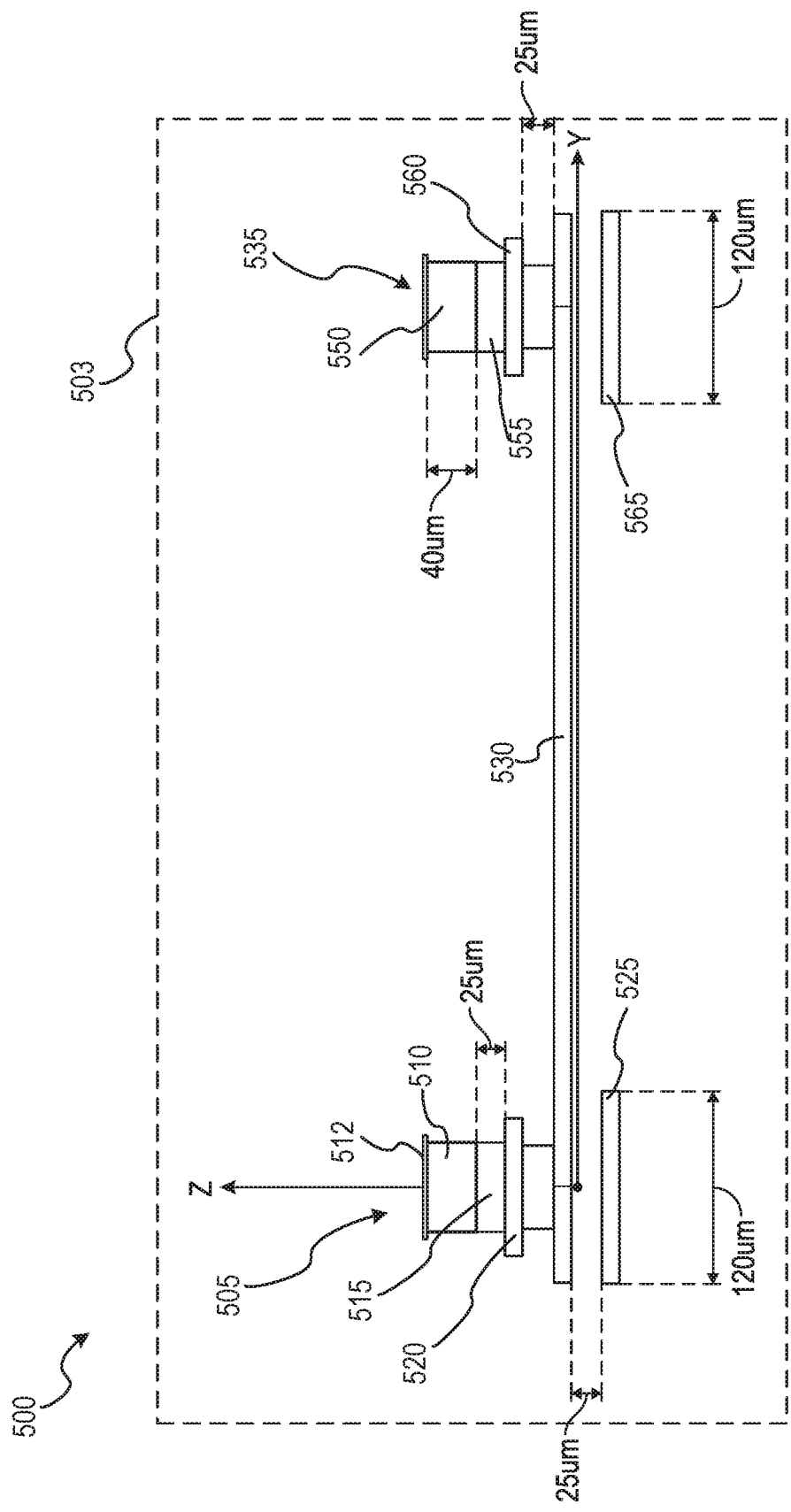
FIG. 5 shows a two-dimensional side view of an interface structure with example measurements, according to some example embodiments.
Figure 6:
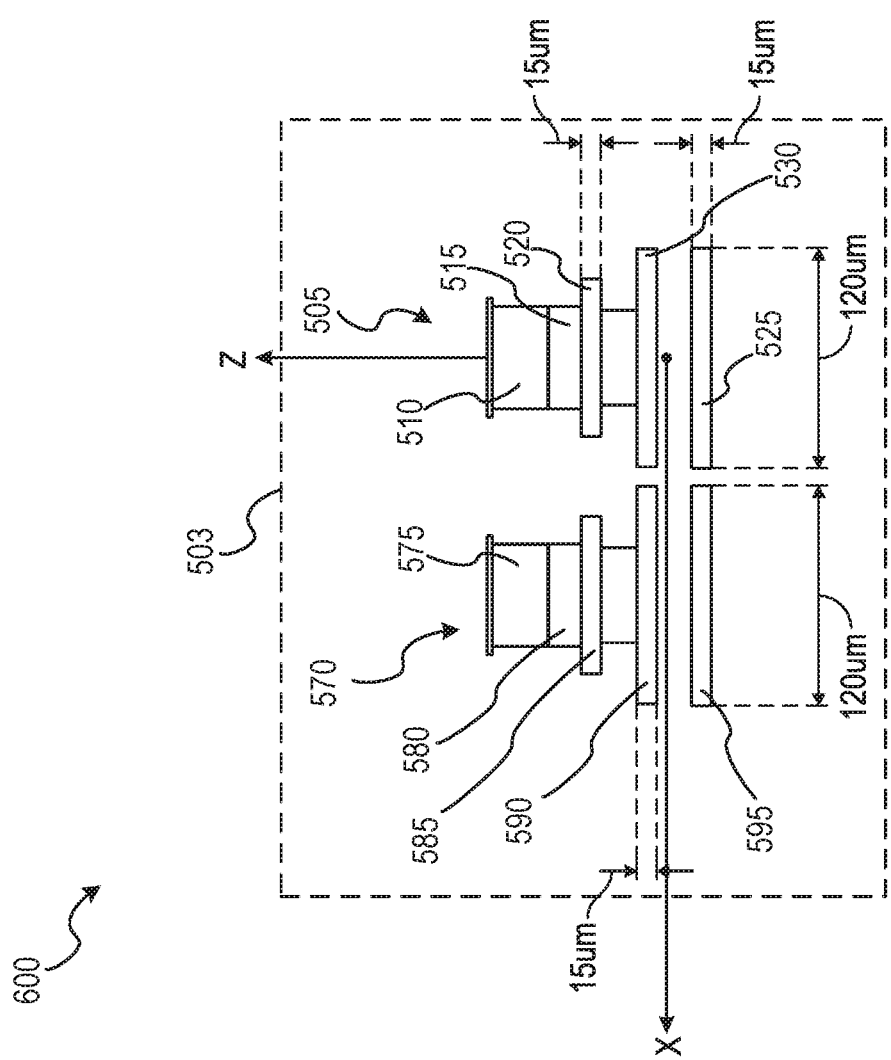
FIG. 6 shows a two-dimensional side view of the interface structure, according to some example embodiments.

FIG. 5 shows a two-dimensional side view 500 (in the Z and Y dimensions) of an interface structure 503 with example measurements, according to some example embodiments. The lines, arrows, and numerical values of measurements depicted in FIG. 5 are used to denote the measurement information and are not part of the physical structure of the interface structure 503, as one of ordinary skill in the art appreciates. Due to the perspective of the side view 500, only one connected pair of via structures is viewable in FIG. 5. The other connected pair of via structures is viewable from another view, which is shown in FIG. 6 and discussed in further detail below.

With reference to the side view 500, a via structure 505 comprises a metallic pillar 510, which can be composed of different conductive metals such as copper, according to some example embodiments. The metallic pillar 510 can include a contact or pad disposed on top of the pillar. The metallic pillar 510 is connected to via 520 using solder 515. The via 520 is connected to the conductive pathway 530 (e.g. a trace). In some example embodiments, the via 520 is a metallic barrel that extends through different layers of a circuit (e.g., reference plane, substrate layer, etc.) The impedance of the via structure 505 is lowered by impedance compensation structure 525 which, as illustrated, is separated from the via structure 505 by a distance, such as 25 µm, according to some example embodiments.

The via structure 505 is electrically connected to the via structure 535 through the conductive pathway 530. As mentioned, the conductive pathway 530 can have a lower impedance value that is significantly lower than the impedance value of the via structure 505. For example, the conductive pathway 530 can be a trace with an impedance of 30 Ohms and the via structure 505 can have an impedance value of 100 Ohms. The impedance compensation structure 525 can lower the impedance value of the via structure 505 so that it is closer to or matches the 30 Ohm impedance of the conductive pathway 530. In some example embodiments, there is in an inverse correlation between the gap size between via structure 505 and impedance compensation structure 525 and the impedance value of via structure 505. As such, the impedance value of via structure 505 can be reduced as necessary (i.e., to match the impedance of 530) by decreasing the distance between impedance compensation structure 525 and via structure 505. However, the dielectric layer that separates via structure 505 from impedance compensation structure 525 may serve as a practical manufacturing limit to how close impedance compensation structure 525 can be positioned to via structure 505. Conversely, increasing the distance will mitigate the impedance lowering effect of impedance compensation structure 525. In some example embodiments, the gap or average distance between the via structure 505 and impedance compensation structure 525 is zero impedance compensation structure 525 is physically attached or placed against via structure 505).

Further, although the example in FIG. 5 shows via structure 505 that includes a pillar 510 and a pad 510, in some example embodiments the via 520 is connected to a trace on another layer of a multi-layer circuit. As an additional example, the barrel section of the via 520 can connect directly to a die (e.g., a PIC, die) without a pad or pillar. In those example embodiments, an impedance compensation structure can likewise be disposed proximate to the via (e.g., the via barrel without the pillar and pad) in a similar manner to lower an impedance difference between the via and conductive pathways connected to the via.

Similar to via structure 505, the via structure 535 comprises a metallic pillar 550 (e.g., a copper metal pillar, a gold metal pillar, a silver metal pillar). The metallic pillar 550 is connected to the via 560 using an adhesive compound or connection material, such as solder 555. The impedance of the via structure 535 is lowered by impedance compensation structure 565 which, as illustrated, is separated from the via structure 535 by 25 µm, according to some example embodiments.

FIG. 6 shows a two-dimensional side view 600 (in the Z and X dimensions) of the interface structure 503, according to some example embodiments. The example numerical values of the measures, lines, and arrows depicted in FIG. 6 are used to denote the measurement information and are not part of the physical structure of the interface structure 503, as one of ordinary skill in the art appreciates. Further, due to the perspective of side view 600, two via structures that are connected to via structures 505 and 570 are not visible from the perspective of side view 600, as one of ordinary skill in the art appreciates.

As illustrated, the via structure 505 and corresponding impedance compensation structure 525 are viewable from the side view 600. Further, the side view 600 illustrates that the side length of the impedance compensation structure 525 and the width of the conductive pathway 530 are the same size, i.e. 120 µm. Further illustrated from the side view 600 is the via structure 570, which includes a metallic pillar 575 which is connected to via 585 by way of solder 580. The via structure 570 is electrically connected to another via structure (not visible in side view 600) by way of conductive pathway 590. Further illustrated in FIG. 6 is in impedance compensation structure 595 that is physically separated from the via structure 570. Like impedance compensation structure 525, the impedance compensation structure 595 also has a size that measures the same length (i.e., 120 µm) as the corresponding conductive pathway 590 that is electrically connected to the via structure 560.

Figure 7:
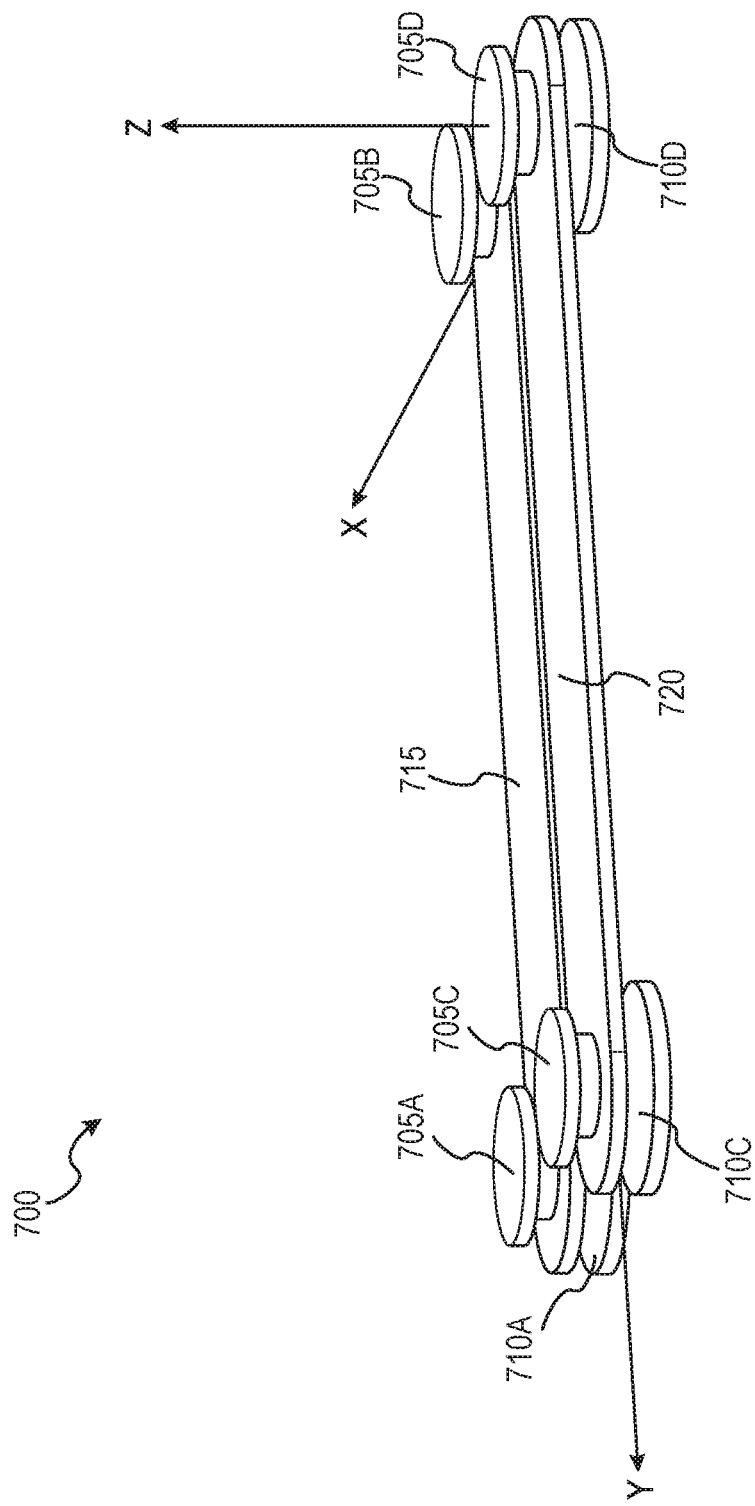
FIG. 7 shows an example high-speed via interface structure using circular impedance compensation structures, according to some example embodiments.

FIG. 7 shows an example high-speed via interface structure 700 using circular impedance compensation structures, according to some example embodiments. As illustrated, the high-speed via interface structure 700 includes a plurality of via structures 705A-705D that can transmit signals between different circuits using conductive pathways (e.g., traces). In particular, for example, via structure 705A is electrically connected to via structure 705B by way of conductive pathway 715. Similarly, via structure 705C is electrically connected to via structure 705D by way of conductive pathway 720. In contrast to the impedance compensation structures discussed above, the impedance compensation structures of high-speed via interface structure 700 are circular structures, which may more readily fit within different circuit layouts while providing impedance compensation benefits. In particular, impedance compensation structure 710A is a circular metallic structure directly underneath via structure 705A, impedance compensation structure 710C is a circular metallic structure positioned underneath via structure 705C, impedance compensation structure 710D is a circular metallic structure positioned underneath via structure 705D, and impedance compensation structure 710B (not viewable from the perspective view of FIG. 7) is located underneath via structure 705B.

Figure 8:
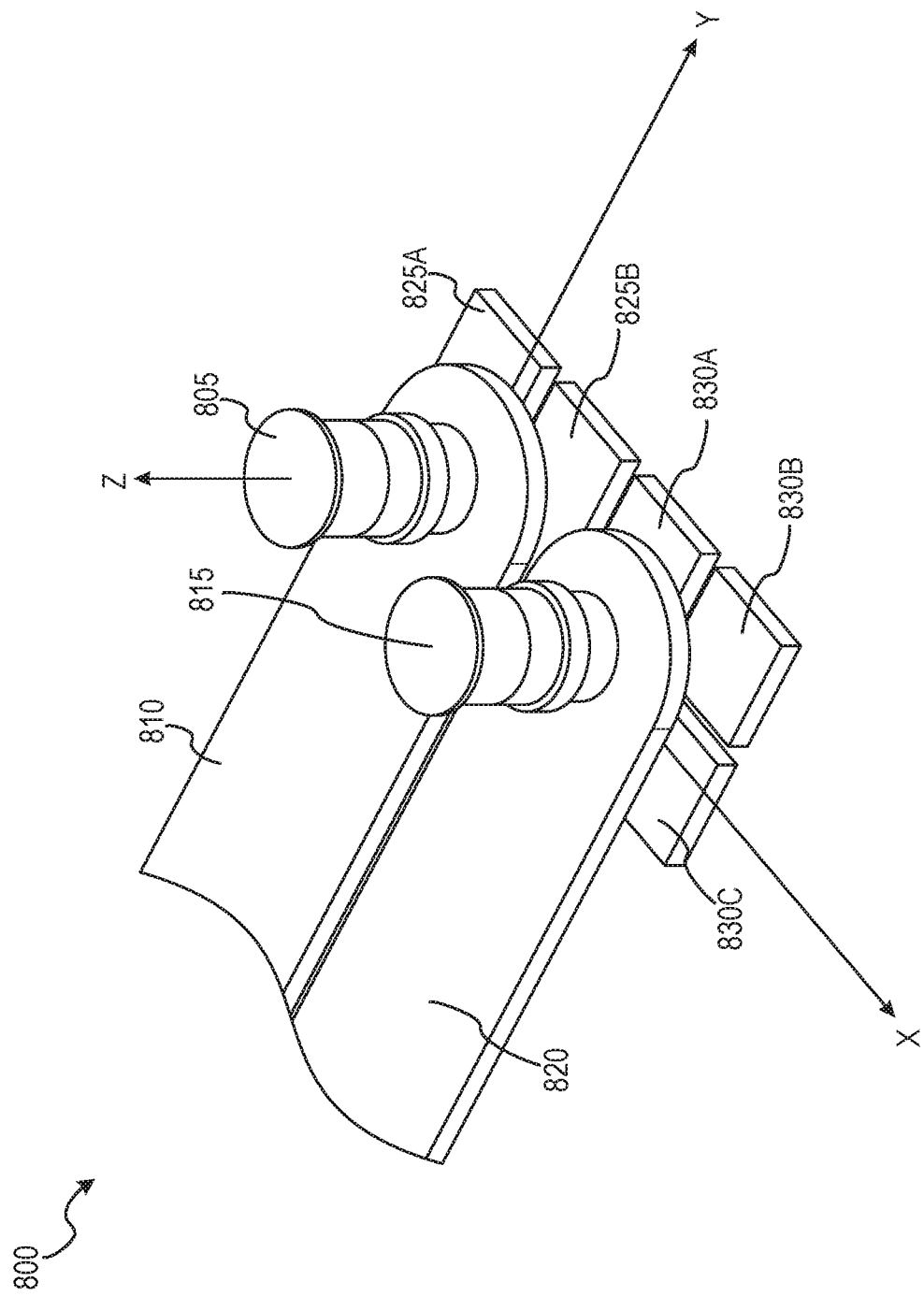
FIG. 8 shows an example high-speed via interface structure using impedance compensation structures that are composed of a plurality of subcomponents, according to some example embodiments.

FIG. 8 shows an example high-speed via interface structure 800 using impedance compensation structures that are composed of a plurality of sub-structures, according to some example embodiments. As illustrated, via structure 805 is connected to another via structure (not depicted in FIG. 8) by way of conductive pathway 810. Likewise, via structure 815 is connected to a further via structure (not depicted in FIG. 8) by way of conductive pathway 820.

In contrast to the impedance compensation structures discussed above, which were monolithic one-piece structures, the impedance compensation structures in the embodiment of FIG. 8 comprise a plurality of sub-structures. In particular, the first impedance compensation structure underneath via structure 805 comprises four square sub-structures 825A-825D, which are physically separated from one another (sub-structure 825C and 825D are blocked by other components are not visible in FIG. 8). Likewise, a second impedance compensation structure that is positioned underneath via structure 815 comprises four square sub-structures 830A-830D. As above, each of the sub-structures 830A-830D are squares that are physically separated from each other. In some of the example embodiments that implement impedance compensation structures that are composed from a plurality of sub-structures, the total width of the plurality of sub-structures has the same or approximately the same width of the corresponding trace or via structure under which the sub-structures are located. For example, the distance from the outer side of sub-structure 830A to the outer side of 830B is the same as the width of the conductive pathway 820.

Figure 9:
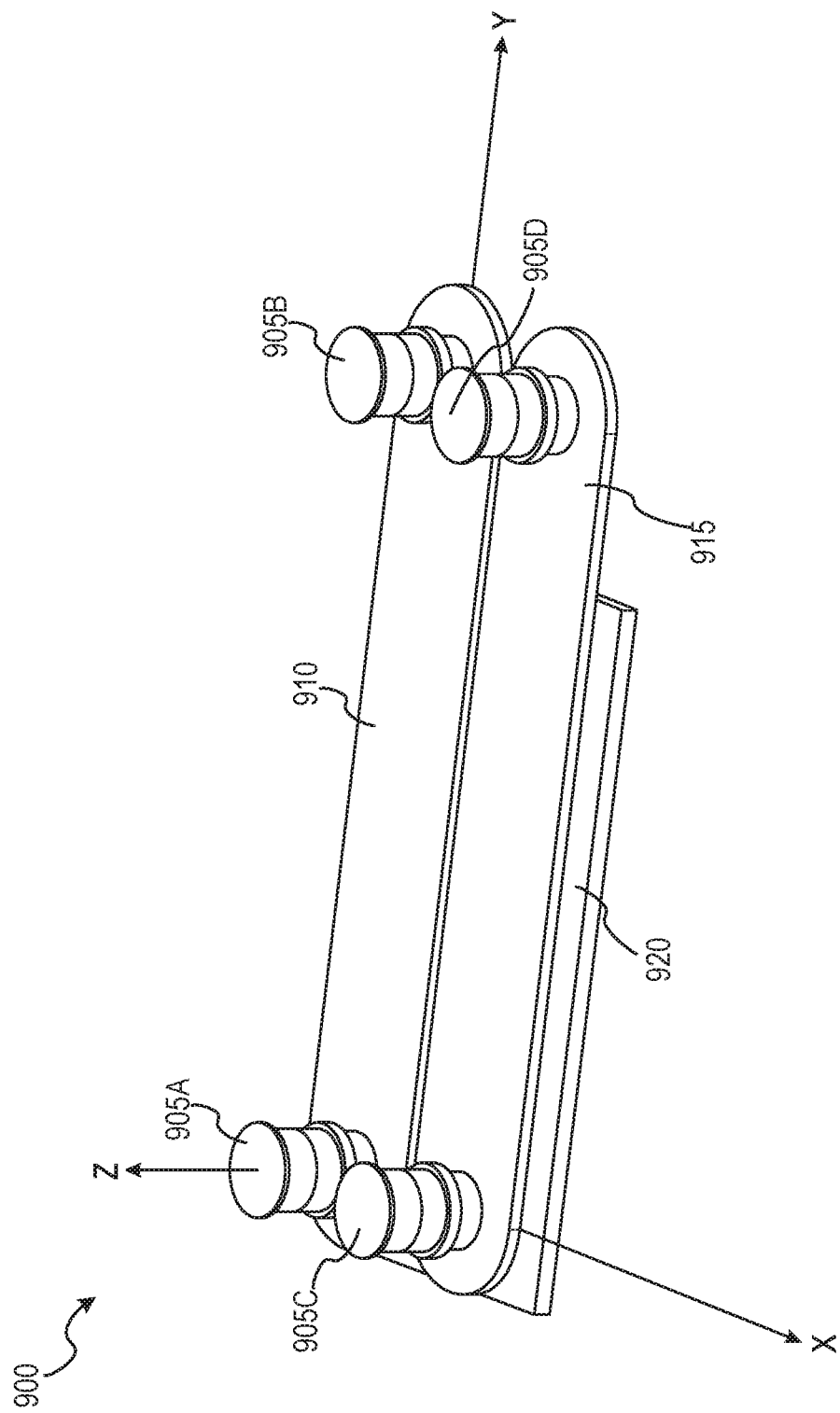
FIG. 9 shows an example high-speed via interface structure using elongated impedance compensation structures, according to some example embodiments.

FIG. 9 shows an example high-speed interface structure 900 using elongated impedance compensation structures, according to some example embodiments. As illustrated, the via structure 905A is electrically connected to via structure 905B by way of conductive pathway 910. Likewise, via structure 905C is electrically connected to via structure 905D by way of conductive pathway 915. In the example embodiment of FIG. 9, the impedance compensation structure 920 is configured as an elongated rectangle having a short side length that is the same or substantially the same as the width of the conductive pathway 915. Further, although not visible from the view perspective of FIG. 9, another elongated impedance compensation structure is situated underneath the via structure 905A and conductive pathway 910, according to some example embodiments.

Figure 10:
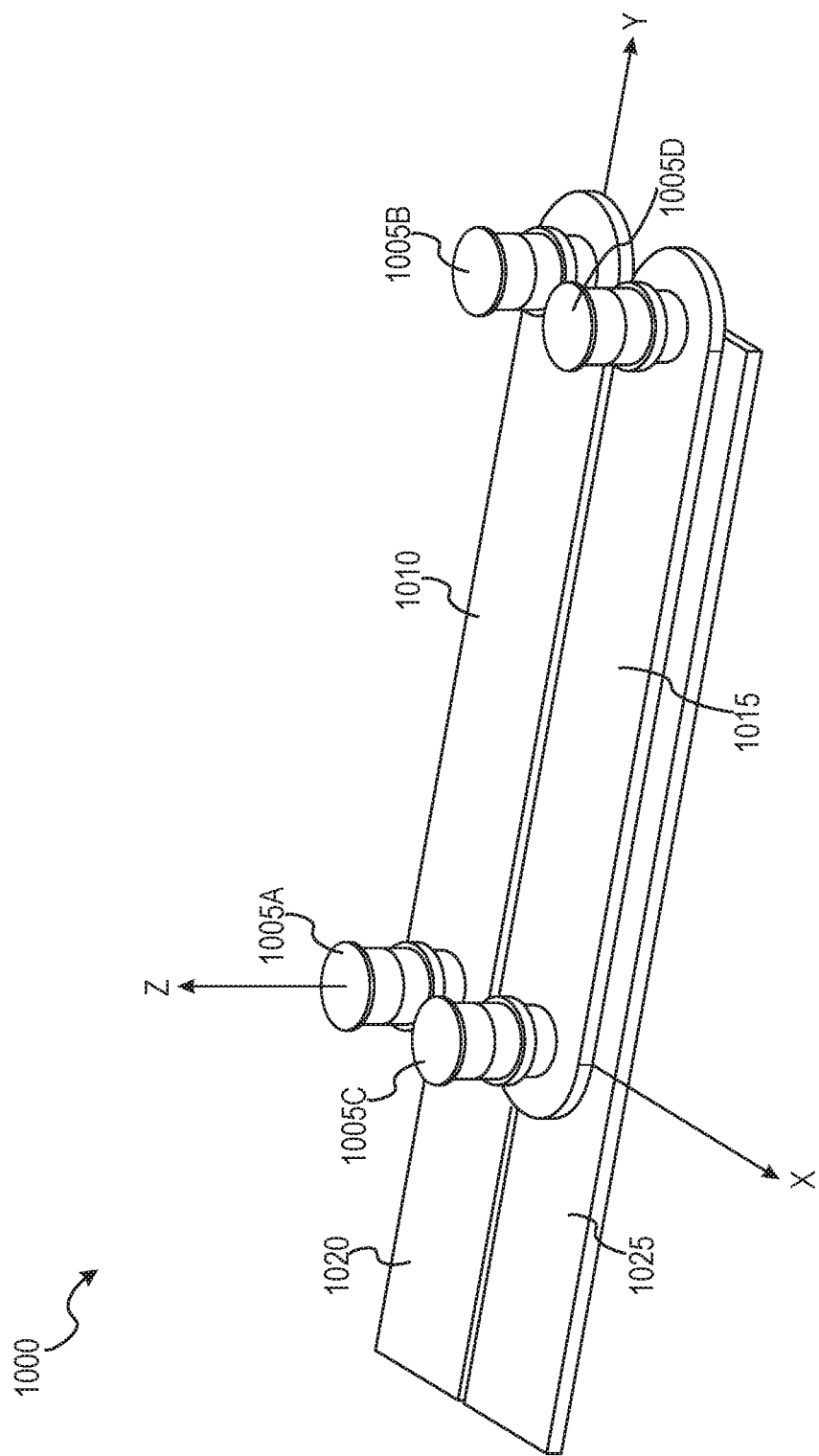
FIG. 10 shows an example high-speed via interface structure using elongated impedance compensation structures, according to some example embodiments.

FIG. 10 shows an example high-speed interface structure 1000 using elongated impedance compensation structures, according to some example embodiments. As illustrated, the via structure 1005A is electrically connected to the via structure 1005B by way of conductive pathway 1010. Likewise, via structure 1005C is electrically connected to via structure 1005D by way of conductive pathway 1015. In the example embodiment of FIG. 10, the impedance compensation structure 1025 is approximately the same width as the width of the via structure 1005 or the conductive pathway 1015. Likewise, the impedance compensation structure 1020 has the same width as the via structure 1005A or the conductive pathway 1010.

Figure 11:
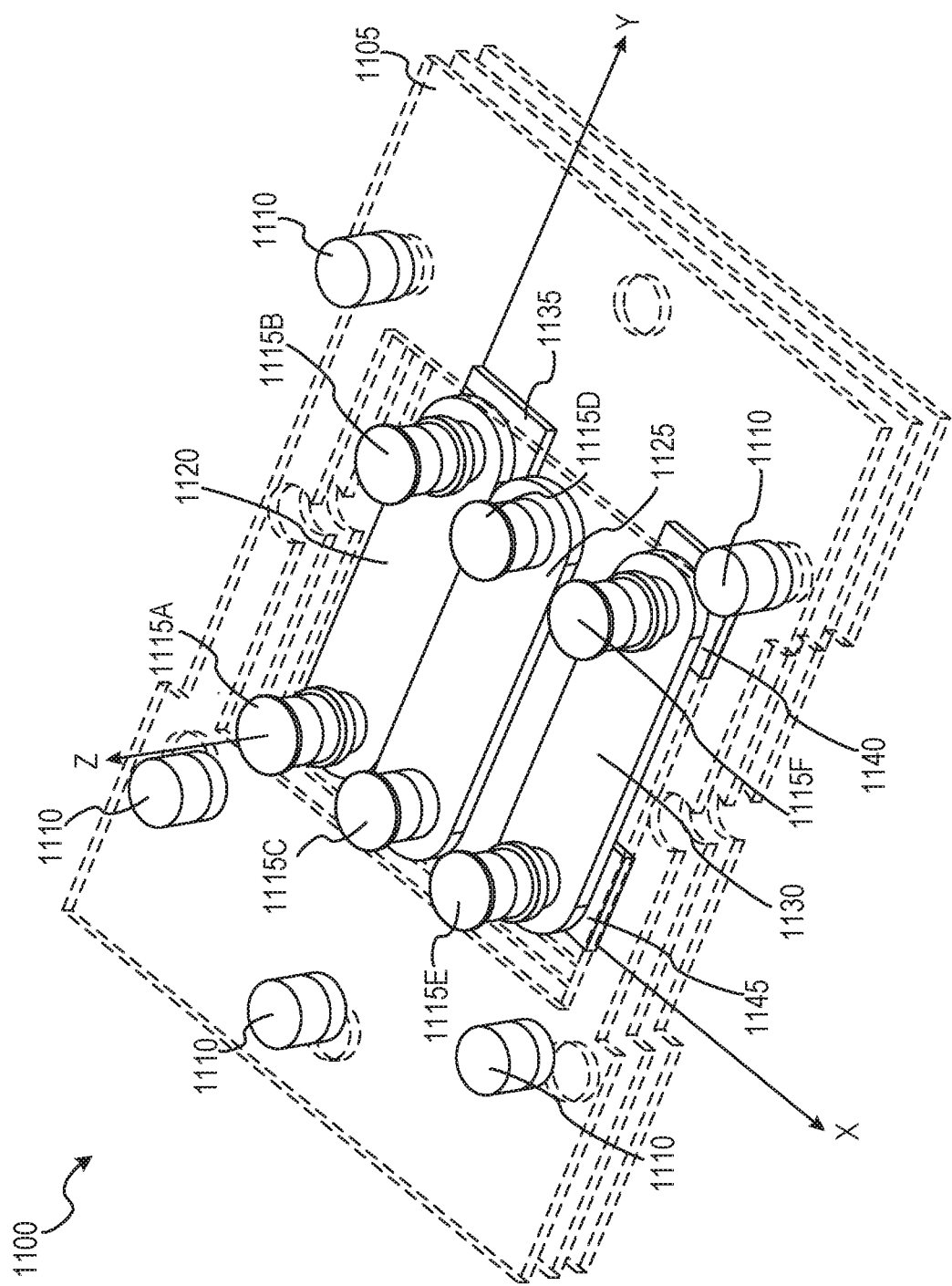
FIG. 11 shows an example high-speed via interface structure in a microstrip configuration, according to some example embodiments.

FIG. 11 shows an example high-speed interface structure 1100 in a microstrip configuration, according to some example embodiments. As illustrated, via structure 1115A is electrically connected to via structure 1115B by way of conductive pathway 1120. Via structure 1115C is electrically connected to via structure 1115D by way of conductive pathway 1125. Further, via structure 1115E is electrically connected to via structure 1115F by way of conductive pathway 1130. In the example embodiment of FIG. 11, one or more ground planes 1105 are electrically connected to grounding vias 1110. As mentioned, the high-speed interface structure 1100 is configured in a microstrip configuration in which some of the conductive pathways are deposited on a top or surface level of a substrate. In particular, conductive pathway 1125 is deposited on a surface of a substrate, while conductive pathway 1120 and conductive pathway 1130 are embedded in a dielectric substrate, according to some example embodiments. In the example illustrated in FIG. 11, the impedance compensation structures are directly positioned under the via structures that have traces that are surrounded by substrate. In particular, square impedance compensation structure 1135 is positioned underneath via structure 1115B, square impedance compensation structure 1140 is positioned under via structure 1115F, square impedance compensation structure 1145 is positioned underneath via structure 1115E, and although not illustrated, an additional square impedance compensation structure is positioned underneath via structure 1115A.

Figure 12:
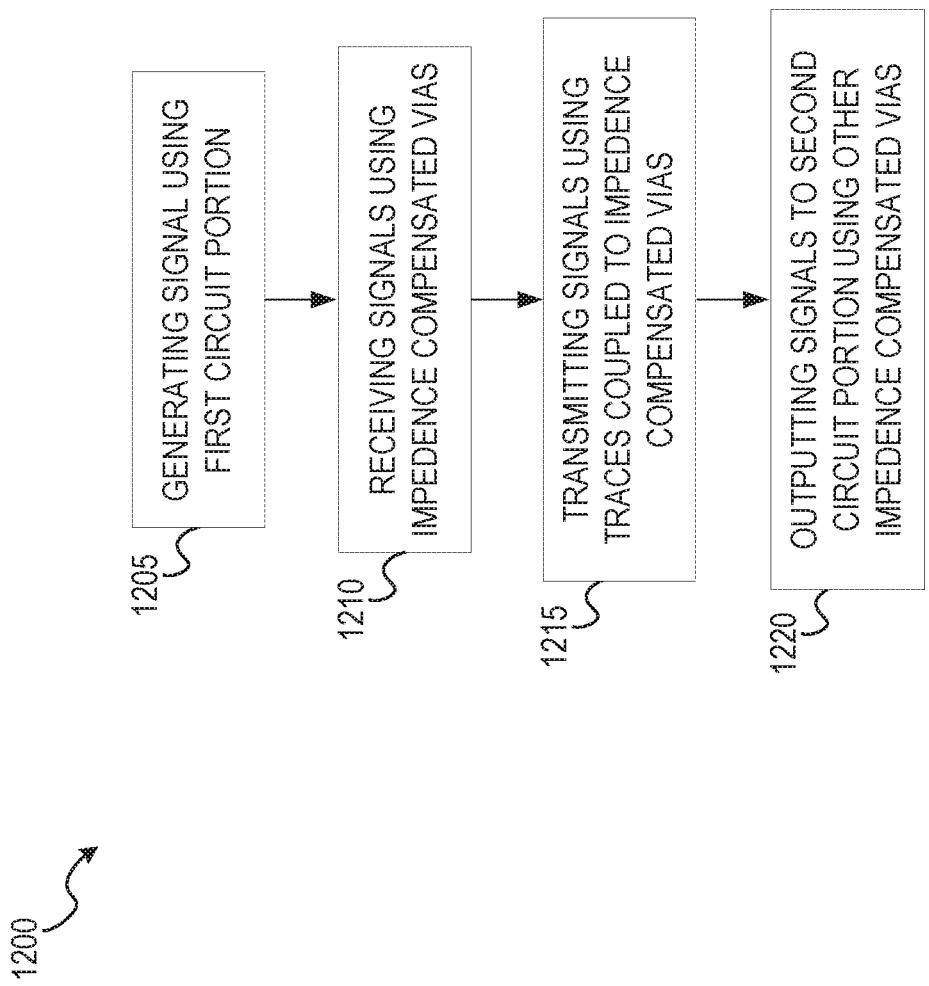
FIG. 12 shows a flow diagram of a method for implementing high-speed via interface structures, according to some example embodiments.

FIG. 12 shows a flow diagram of a method 1200 for implementing high-speed via interface structures, according to some example embodiments. At operation 1205, a first circuit portion generates one or more signals. For example, a PIC die integrated into circuit module structure 210 generates one or more photonic signals which can be converted into electrical signals and output to one or more output terminals. At operation 1210, impedance compensated vias receive the signals generated at operation 1205. For example, one or more via structures having impedance compensation structures located underneath them receive the signals generated by the PIC die. At operation 1215, the signals received by the via structures are transmitted to other via structures using one or more conductive pathways. As discussed above, the other via structures can also be impedance compensated in that they have corresponding impedance compensation structures positioned underneath respective via structures. At operation 1220, the other via structures output the received signals to a second circuit portion. For example, the other via structures receive the signals from the traces and output the signals to a transmit die, which is integrated into the circuit module structure 210.

Figure 13:
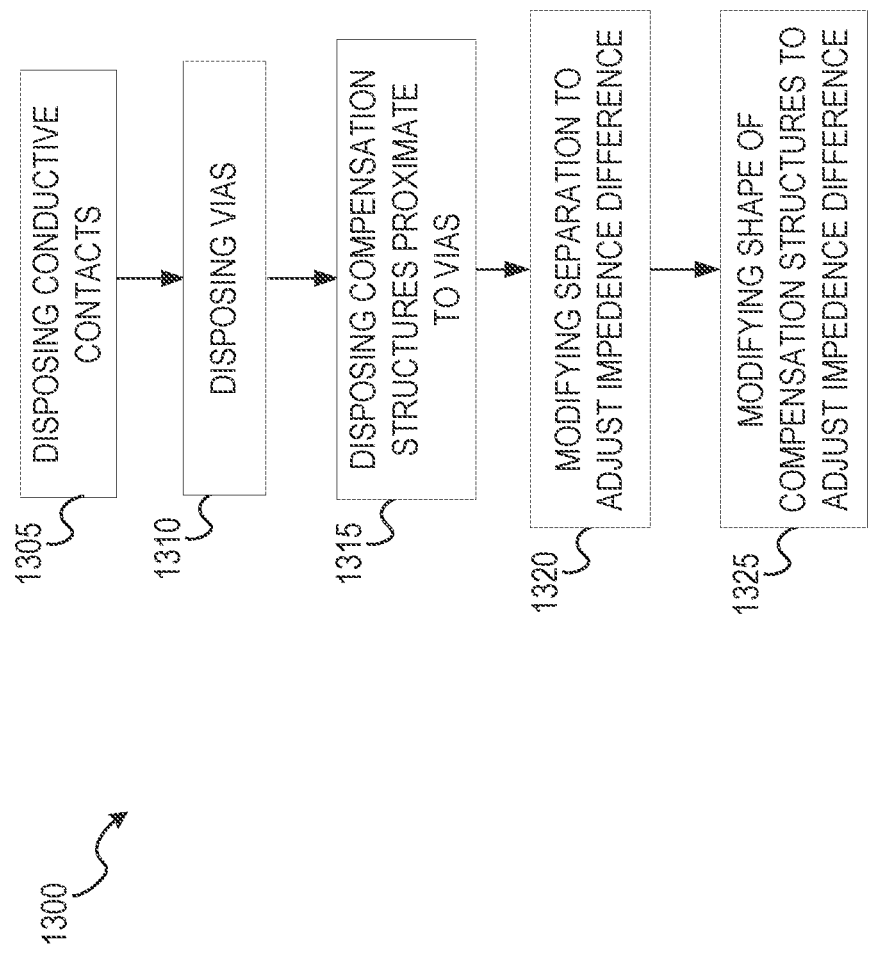
FIG. 13 shows a flow diagram of a method for manufacturing high-speed via interface structures, according to some example embodiments.

FIG. 13 shows a flow diagram of a method 1300 for manufacturing high-speed via interface structures, according to some example embodiments. At operation 1305, one or more conductive contacts (e.g., traces, pillars, pads, etc.) are disposed on a circuit. For example, at operation 1305 a trace can be disposed on one side (e.g., a bottom-side) of a circuit layer and another trace can be disposed on an opposing side (e.g., a top-side) of the circuit layer. In some example embodiments, the conductive contacts are disposed on different layers of a circuit. For example, a trace can be disposed on a first layer of a three-layer circuit, and another trace can be disposed on the third layer of the three-layer circuit. At operation 1310, one or more vias are disposed in the circuit to interconnect components (e.g., traces, pillars, pads, dies). For example, a via barrel can be inserted through one or more layers to interconnect traces located on different layers. In some example embodiments, the vias are via structures that have conductive contacts (e.g., a pillar, a pad) attached to the via barrels, as discussed above.

Although operation 1310 is shown as the second operation of method 1300, one of ordinary skill in the art appreciates that, in some example embodiments, the ordering can be modified to interconnect various components in different circuit configurations (e.g., a stripline circuit configuration, a microstrip circuit configuration, etc.). For example, a trace can be placed in a substrate of a circuit, followed by inserting a via through a layer of the circuit, followed by attaching a pillar and pad to the via, as discussed above.

At operation 1315, compensation structures are placed proximate (e.g., near) to the via structures. For example, a square impedance compensation structure made of the same material as the via structure can be placed underneath the via structure such that the square impedance compensation structure is physically separated from the via structure by a distance, e.g. 25 μm. As discussed above, the impedance compensation structures can have a length that is the same as the width of the via structure or trace connected to the via structure, according to some example embodiments.

At operation 1320, the physical gap that separates a given impedance compensation structure from its corresponding via structure is adjusted to increase or lower the impedance of that via structure. For example, at operation 1320, the impedance compensation structure can be positioned closer to its via structure to lower the via structure's impedance so that it closer matches in impedance of a connected trace. In some example embodiments, there is no physical gap and the impedance compensation structure is affixed to the via structure or placed against the via structure to lower the impedance of the via structure. As a further example, at operation 1320, the impedance compensation structure can be positioned farther away from its via structure to increase the relative impedance of that via structure. In some example embodiments, the combined impedance of the via structure and its corresponding impedance compensation structure is measured. After measurement, if the combined impedance is still higher than the impedance of the connected trace, the distance between the via structure and its corresponding impedance compensation structure is decreased until the combined impedance matches the impedance of the connected trace.

At operation 1325, the shape of the impedance compensation structure is modified to change the amount of impedance difference between a corresponding via structure and a conductive pathway connected to that via structure. For example, at operation 1325, the size of the impedance compensation is decreased such that it is smaller in width than its corresponding via structure. As a further example, at operation 1325, the size of the impedance compensation structure can be increased such that its width is larger (e.g., 30% larger) than the width of the via structure or conductive pathway.

Figure 14:
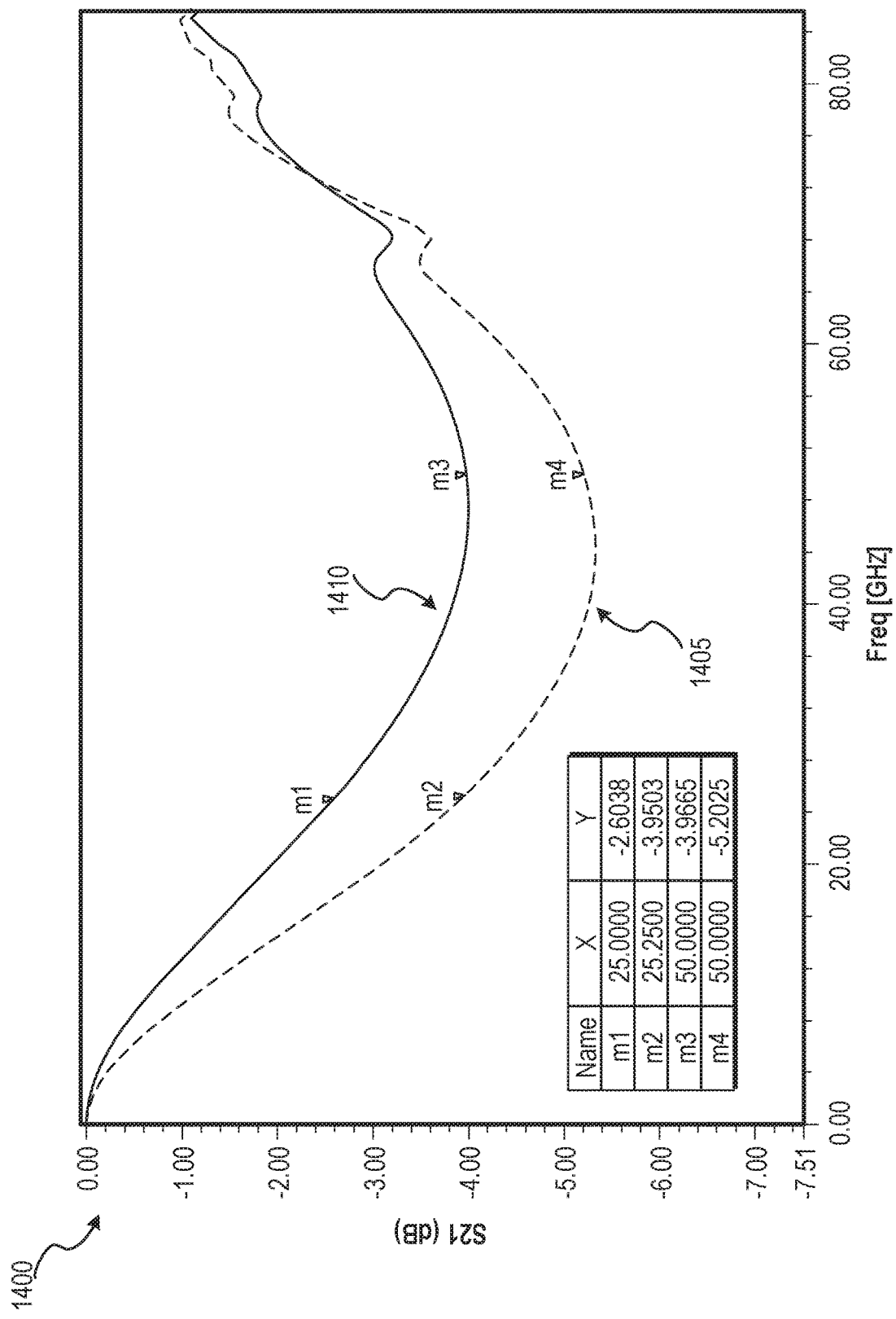
FIG. 14 shows an example graph showing improved insertion loss results of the high-speed via interface structure, according to some example embodiments.

FIG. 14 shows an example graph 1400 showing improved insertion loss results of the high-speed via interface structure, according to some example embodiments. As illustrated, graph 1400 is an insertion loss graph with loss on the vertical axis (in decibels, dB) and frequency on the horizontal axis (in hertz, Hz). Further illustrated is result plot 1405 that shows signal loss of a conventional system across a range of frequencies and result plot 1410 that shows signal loss of a high-speed via structure as discussed above. As can be seen in graph 1400, the high-speed via structure exhibits significantly reduced signal loss across a large range of frequencies.

The following are examples of embodiments:

A circuit comprising: a conductive contact disposed on a side of a circuit board; a conductive path disposed on an opposed side of the circuit board; a via structure extending through the circuit board, the via structure interconnecting the conductive contact and the conductive path; and an impedance compensation structure positioned proximate to the via structure to decrease an impedance difference between the via structure and the conductive path.

2. The circuit of example 1, wherein the impedance compensation structure is proximate to a portion of the via structure that is connected to the conductive path.

3. The circuit of examples 1 and 2, wherein the impedance compensation structure is physically separated from a portion of the via structure that is connected to the conductive path.

4. The circuit of examples 1-3, wherein the impedance compensation structure and the conductive path have a same width size.

5. The circuit of examples 1-4, wherein the impedance compensation structure has a width size and the conductive path has another width size that is smaller than the width size of the impedance compensation structure.

6. The circuit of examples 1-5, wherein the impedance compensation structure has a width size and the conductive path has another width size that is larger than the width size of the impedance compensation structure.

7. The circuit of examples 1-6, wherein the side and the opposed side are opposite sides of a ground layer of the circuit board, the via structure extending through the ground layer of the circuit board.

8. The circuit of examples 1-7, wherein the circuit board has multiple layers including a first layer and a second layer, and wherein the side is a surface of the first layer of the circuit board and the opposed side is another surface of the second layer of the circuit board, the via structure extending through the first layer and the second layer of the circuit board.

9. The circuit of examples 1-8, further comprising: a substrate layer comprising dielectric material, the via structure partially extending through a portion of the substrate layer, the impedance compensation structure is embedded in dielectric material of the substrate layer.

10. The circuit of examples 1-9, wherein the impedance compensation structure and the via structure are aligned.

11. The circuit of examples 1-10, wherein the impedance compensation structure is metallic.

12. The circuit of examples 1-11, wherein the impedance compensation structure is one of: a parallelogram shaped structure, a circular shaped structure, or a plurality of separated sub-structures that have a width that matches further width of the conductive path.

13. The circuit of examples 1-12, wherein the conductive contact is a terminal that that connects to an external circuit.

14. The circuit of examples 1-13, wherein the circuit is a multilayer circuit in which the conductive path is a trace surrounded by a dielectric substrate.

15. A method of manufacturing a circuit board, the method comprising: disposing a conductive path on a side of the circuit board; disposing a contact on an opposed side of the circuit board; disposing via structure that extends through the circuit board, the conductive path and the contact being interconnected by the via structure; and disposing, in a dielectric substrate of the circuit board, an impedance compensation structure to decrease an impedance difference between the via structure and the conductive path, the impedance compensation structure being proximate to the via structure.

16. The method of manufacturing of example 15, wherein the impedance compensation structure is proximate to a portion of the via structure that is connected to the conductive path.

17. The method of manufacturing of examples 15 and 16, wherein the conductive path is disposed in a substrate layer of the circuit board.

18. The method of manufacturing of examples 15-17, wherein the impedance compensation structure is separate from the via structure by dielectric substrate material of the substrate layer.

19. The method of manufacturing of examples 15-18, wherein the impedance compensation structure and the conductive path have a same width size.

20. A structure for circuit interconnects, comprising: a first grounding plane; a second grounding plane; a substrate layer of dielectric material between the first grounding plane and the second grounding plane; a trace embedded in the substrate layer; a pillar; a via structure extending through the first grounding plane, the via structure comprising a first end portion connected to the pillar and a second end portion connected to the trace; and an impedance compensation structure positioned proximate to the second end portion of the via structure to decrease an impedance difference between the via structure and the trace.

While various embodiments have been described above, it should be understood that they have been presented by way of example only, and not limitation. Where methods described above indicate certain events occurring in a certain order, the ordering of certain events may be modified. Additionally, certain of the events may be performed concurrently in a parallel process when possible, as well as performed sequentially as described above. Accordingly, the specification is intended to embrace all such modifications and variations of the disclosed embodiments that fall within the spirit and scope of the appended claims.

What is claimed is:

1. A circuit comprising:
a conductive contact disposed on a side of a circuit board;
a conductive path disposed on an opposed side of the circuit board;
a first via structure extending through the circuit board, the first via structure interconnecting the conductive contact and the conductive path;
a second via structure extending through the circuit board that is connected to the first via structure by the conductive path,
the circuit board including a first layer,
a second layer,
and a ground layer disposed between the first layer and the second layer,
the second layer comprising dielectric material,
wherein the side is a surface of the first layer of the circuit board and the opposed side is another surface of the second layer of the circuit board,
the first via structure extending through the first layer and the ground layer of the circuit board,
the first via structure partially extending through a portion of the second layer; and
an elongated metallic path embedded in the dielectric material of the second layer,
separate from the first via structure,
and disposed directly beneath and axially aligned with the first via structure and extending along the conductive path towards the second via structure,
the elongated metallic path and the conductive path having a same width to decrease an impedance difference between the first via structure and the conductive path.

2. The circuit of claim 1, wherein the elongated metallic path is separated from the conductive path.

3. The circuit of claim 1, wherein the elongated metallic path and the conductive path are aligned.

4. The circuit of claim 1, wherein the elongated metallic path is a parallelogram shaped structure.

5. The circuit of claim 1, wherein the conductive contact is a terminal that connects to an external circuit.

6. The circuit of claim 1, wherein the circuit is a multilayer circuit in which the conductive path is a trace surrounded by the dielectric material.

7. A method of manufacturing a circuit board, the method comprising:
disposing a conductive path on a side of the circuit board;
disposing a contact on an opposed side of the circuit board;
disposing first via structure that extends through the circuit board, the conductive path and the contact being interconnected by the first via structure;
disposing a second via structure that extends through the circuit board, the second via structure being connected to the first via structure by the conductive path,
the circuit board including a first layer,
a second layer,
and a ground layer disposed between the first layer and the second layer,
the second layer comprising dielectric material,
wherein the side is a surface of the first layer of the circuit board and the opposed side is another surface of the second layer of the circuit board,
the first via structure extending through the first layer and the ground layer of the circuit board,
the first via structure partially extending through a portion of the second layer; and
disposing, in the dielectric material of the second layer of the circuit board, an elongated metallic path that is separate from the first via structure,0
and disposed directly beneath and axially aligned with the first via structure and extending along the conductive path towards the second via structure,
the elongated metallic path and the conductive path having a same width to decrease an impedance difference between the first via structure and the conductive path.

8. The method of manufacturing of claim 7, wherein the elongated metallic path is separated from the conductive path.

9. The method of manufacturing of claim 7, wherein the elongated metallic path and the conductive path are aligned.

10. The method of manufacturing of claim 7, wherein the elongated metallic path is a parallelogram shaped structure.

11. The method of manufacturing of claim 7, wherein the conductive contact is a terminal that connects to an external circuit.

12. A structure for circuit interconnects, comprising:
a first grounding plane;
a second grounding plane;
a substrate layer of dielectric material between the first grounding plane and the second grounding plane;
a trace embedded in the substrate layer;
a pillar;
a first via structure extending through the first grounding plane,
the first via structure comprising a first end portion connected to the pillar and a second end portion connected to the trace;
a second via structure extending through the first grounding plane,
the second via structure being connected to the first via structure by the trace; and
an elongated metallic path embedded in the dielectric material of the substrate layer,
separate from the first via structure,
and disposed directly beneath and axially aligned with the first via structure and extending along the trace towards the second via structure,
the elongated metallic path and the trace having a same width to decrease an impedance difference between the first via structure and the trace.

13. The structure for circuit interconnects of claim 12, wherein the elongated metallic path is separated from the trace.

14. The structure for circuit interconnects of claim 12, wherein the elongated metallic path and the trace are aligned.

15. The structure for circuit interconnects of claim 12, wherein the elongated metallic path is a parallelogram shaped structure.

16. The structure for circuit interconnects of claim 12, wherein the pillar is a terminal that connects to an external circuit.

17. The structure for circuit interconnects of claim 12, wherein the structure is a multilayer circuit and the trace is surrounded by the dielectric material.

* * * * *